United States Patent
Yamada

(10) Patent No.: US 6,175,252 B1
(45) Date of Patent: Jan. 16, 2001

(54) DRIVER CIRCUIT

(75) Inventor: Takashi Yamada, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/304,270

(22) Filed: May 6, 1999

(30) Foreign Application Priority Data

May 20, 1998 (JP) ................................................. 10-153713

(51) Int. Cl.$^7$ ............................................. H03K 19/0175
(52) U.S. Cl. ................................. 326/83; 326/31; 326/86
(58) Field of Search ........................... 327/108; 307/270, 307/443; 326/83, 80, 31, 86

(56) References Cited

U.S. PATENT DOCUMENTS

| | | | |
|---|---|---|---|
| 3,631,267 | * 12/1971 | Heimbigner | 307/270 |
| 4,829,199 | * 5/1989 | Prater | 307/443 |
| 5,293,082 | * 3/1994 | Bathaee | 307/270 |
| 5,598,118 | * 1/1997 | Koifman et al. | 327/108 |

FOREIGN PATENT DOCUMENTS

S63-211906  9/1988 (JP).
S64-16017   1/1989 (JP).

* cited by examiner

Primary Examiner—David Nelms
Assistant Examiner—Thong Le
(74) Attorney, Agent, or Firm—Sughrue, Mion, Zinn, Macpeak & Seas, PLLC

(57) ABSTRACT

There is provided a driver circuit which does not require a large driving current, even when a logic circuit having a large capacity component is connected as the load.

When the input voltage level is "H", the first driving means inserted between the source and the load is maintained at the on state and it is turned off when it is detected by the first detecting means that the voltage level of the load exceeds the first voltage level. When the input voltage level is "L", the second driving means inserted between the ground and the load is maintained at the on state and it is turned off when it is detected by the second detecting means that the voltage level of the load is below the second voltage level. The above mentioned first voltage level is higher than the logic threshold of the logic gate for receiving signals from the driver circuit, and the above mentioned second voltage level is lower than the logic threshold of the logic gate for receiving signals from the driver circuit.

18 Claims, 4 Drawing Sheets

DRIVER CIRCUIT

BACKGROUND OF THE INVENTION

1. Field of the Invention

The present invention relates to a driver circuit suitable for use as an output stage of logic circuits formed in Large Scale Integrated Circuits (LSI).

2. Background Art

Some logic circuits formed in LSIs are provided with driver circuits for the purpose of driving a large capacitive load at the output stage. FIG. 4 shows such a driver circuit 50 and an overview of the output side.

The driver circuit shown in FIG. 4 is connected to the PMOS-Tr (P-channel Metal Oxide Semiconductor field effect Transistor) 52 and NMOS-Tr (N-channel Metal Oxide Semiconductor field effect Transistor) 53, and the output end of the driver circuit is connected to the gate terminal of the PMOS-Tr 52 and the gate terminal of the NMOS-Tr 53, and the driver circuit 50 is provided with an inverter 51 which is a pre-driver for driving the PMOS-Tr 52 and the NMOS-Tr 53.

The output terminal 74 of the driver circuit 50 is connected with a logic circuit 62 having a gate 63 as an inputting stage for receiving the signals from the driver circuit 50. This output terminal 74 is also to be connected to capacitive load 61 such as a floating capacity which is carried on a wiring to the logic circuit 62 and an input capacity of the gate 63.

When an "H" (high voltage level) signal is input at the data input end 71 of the driver circuit 50, the driver circuit 50 charges the large capacitive load 61 connected to the output terminal 74 of the driver circuit 50. When, in contrast, the "L" (low voltage level) signal is input at the data input end 71, the driver circuit 50 discharges the large capacitive load 61.

However, problems arise in the driving circuit structure shown in FIG. 4 as follows. The first problem is that the conventional driving circuit requires a high driving current and its operating speed is low, since the load capacity is fully oscillated in a voltage range corresponding to the driving voltage.

The second problem is the wide gate width, since it is required for the PMOS-Tr 52 and the NMOS-TR 53 to have the ability to output large electric currents. Consequently, it is likely that noise components will be carried on wiring to the electric source or wiring to the ground. The third problem is that the penetration current becomes large during load driving for the same reasons as described above.

It is therefore the object of the present invention to provide a driver circuit which does not require a high output current even if a logic circuit with a large capacitive component is connected as a load, and which is capable of high speed operation or of reduced noise.

SUMMARY OF THE INVENTION

According to the first aspect of the present invention, a driver circuit comprises: a first detecting means for detecting that a voltage level at the load side exceeds the first voltage level (VthH) existing between the source potential voltage level and the logic threshold voltage level of a logic gate located at the receiving side; a second detecting means for detecting that the voltage level at the load side is below the second voltage level (VthL) existing between a ground potential voltage level and said first voltage level; a first driving element for switching on/off of the connection between the electric source and the load based on an input voltage level and the detection results by said first detecting means; and a second driving element for switching on/off of the connection between the ground potential and the load based on the input voltage level and the detection result by said second detecting means.

According to the second aspect of the present invention, in a driver circuit according to the first aspect, said first detecting means comprises a logic gate having a high logic threshold value, and the logic gate being an inverter comprising a P-channel field effect transistor having a large ratio of gate width to gate length and an N-channel field effect transistor having a small ratio of gate width to gate length.

According to the third aspect of the present invention, in a driver circuit according to the first aspect, said first detecting means comprises a logic gate having a low logic threshold value, and said logic gate being an inverter comprising a P-channel field effect transistor having a small ratio of the gate width to the gate length and an N-channel field effect transistor having a large ratio of the gate width to the gate length.

According to the fourth aspect of the present invention, in a driver circuit according to the first aspect, when said input voltage level is at a high voltage level, said first driving means is maintained in the on state until it is detected that the voltage level of the load exceeds said first voltage level by said first detecting means; and, said first driving means is turned off when the voltage level of the load exceeds the first voltage level by said first detecting means.

According to the fifth aspect of the present invention, in a driver circuit according to the first aspect, when the input voltage level is at a low voltage level, said second driving means is maintained in the on state until it is detected that the voltage level of the load exceeds said second voltage level by the second detecting means; and said second driving means is turned off when the voltage level of the load exceeds the first voltage level by said second detecting means.

According to the sixth aspect of the present invention, a driver circuit comprises a first driving means to be turned on when the input voltage level is at a high voltage level; and a third driving means to be turned off when the voltage level of the load exceeds the first voltage level; wherein said first driving means and said third driving means are connected in series between the source voltage source and said load.

According to the seventh aspect of the present invention, a driver circuit comprises: a second driving means to be turning on when the input voltage level is at a high voltage level; and a fourth driving means to be turning off when the voltage level of the load is below the second voltage level; wherein said fourth driving means and said second driving means are connected in series between a ground potential and said load.

According to the eighth aspect of the present invention, in a driver circuit according to claim 1, said first voltage level is higher than the logic threshold of the logic gate for receiving signals from the driver circuit and said first voltage level is a potential which makes the penetration current flowing in said logic gate to a sufficiently small level when said voltage level is input in the logic gate located at the receiving side.

According to the ninth aspect of the present invention, in a driver circuit according to claim 1, said second voltage level is below the logic threshold of the logic gate at the receiving side for receiving signals from the driver circuit and said second voltage level corresponds to a voltage so as to reduce the penetration current flowing in said logic gate sufficiently small when said voltage level is input in the logic gate located at the receiving side.

According to the present invention, the first driving means for switching on or off a connection between the source voltage and the load, when the input voltage level is high, maintains the on state until the load voltage level exceeds the first voltage level by the first detecting means, and turns off when it is detected that the load voltage level is below the first voltage level. The second driving means for switching on/off between the ground potential and the load, when the input voltage level is low, maintains the on state until the second detecting means detects that the load voltage level is below the second voltage level, and turns off when the second detecting means detects that the load voltage level is below the second voltage level.

Furthermore, there are provided a first driving means and a third driving means connected in series between the source voltage and the load, and a second driving means and a fourth driving means connected in series between the load and the ground potential. When the input voltage level is high, the first driving means is turned on, and the third driving means is turned off when the load voltage level exceeds the first voltage level. The second driving means is turned off when the load voltage level exceeds the first voltage level, the fourth voltage level is turned off when the load voltage level is below the second voltage level. The first voltage level is set such that it is higher than the logic threshold of the logic gate which receives signals from the driver circuit and, when it is input into the logic gate at the receiving side, the first voltage level is able to make the penetration current flowing in the logic gate sufficiently small. The second voltage level is set to be lower than the logic threshold value of the logic gate for receiving the signals from the driver circuit and when it is input into the logic gate at the receiving side, the second voltage level is able to make the penetration current flowing in the logic gate sufficiently small.

DETAILED DESCRIPTION OF THE PREFERRED EMBODIMENT

A. First Embodiment

Figure 1:
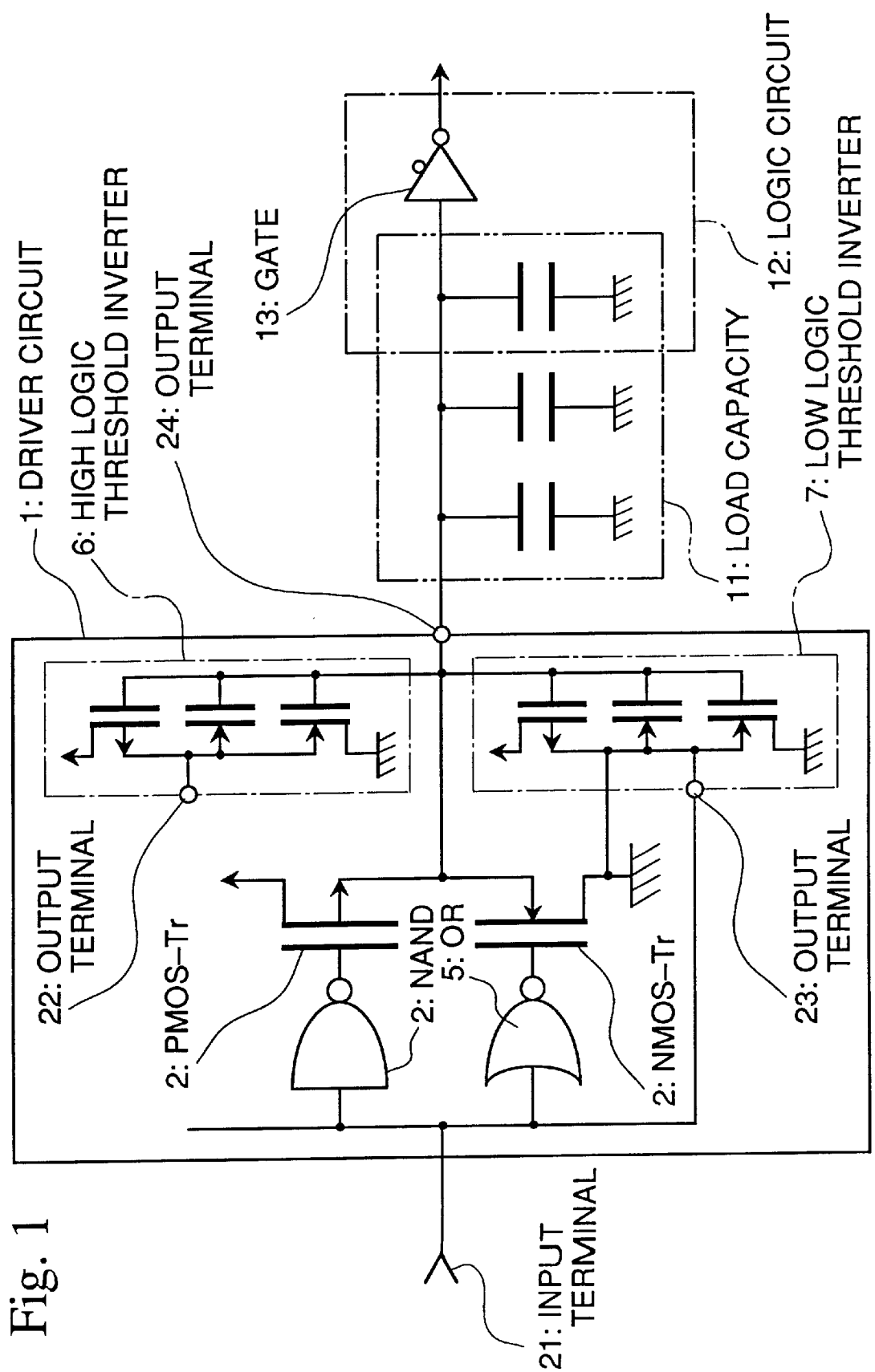
FIG. 1 is a connection diagram showing the construction of the driver circuit according to the first embodiment of the present invention.

Hereinafter, the first embodiment of the present invention will be described. FIG. 1 is a connection diagram showing the construction of the driver circuit according to the first embodiment of the present invention.

In FIG. 1, the reference numeral 1 is a driver circuit of the present invention. A logic circuit which has at its output stage, for example, a gate 13 (a clocked inverter is used in this embodiment) for receiving signals from the driver circuit 1 is connected to the output terminal 24 of the driver circuit 1.

The load connected to the output terminal 24 includes a floating capacity which is carried by the wiring to the logic circuit 12 and a capacitive load such as the input capacity of the gate 13.

The reference numeral 2 in the driver circuit 1 is a PMOS-Tr, and 3 is a NMOS-Tr. These PMOS-Tr 2 and NMOS-Tr 3 form a driver with a high current output.

The reference numeral 6 is a high logic threshold inverter, the input terminal of which is connected to the output terminal 24 of the driver circuit 1. Numeral 7 is a low logic threshold inverter, the input terminal of which is also connected to the output terminal 24.

The reference numeral 4 is a NAND gate (negative logic output AND) having two input terminals. The output terminal of the NAND gate 4 is connected to the gate terminal of the PMOS-Tr 2. One of the input terminals of the NAND gate 4 is connected to the output terminal 22 of the high logic threshold inverter 6, and another input terminal of the NAND gate 4 is connected to the input terminal 21.

The reference numeral 5 represents a gate of a NOR (negative logic output OR) having two input terminals. The output terminal of the NOR gate 5 is connected to the gate terminal of the NMOS-Tr 3. One of the input terminals of the NOR gate 5 is connected to the output terminal 23 of the low logic threshold inverter 7 and another input terminal is connected to the input terminal 21.

Figure 2:
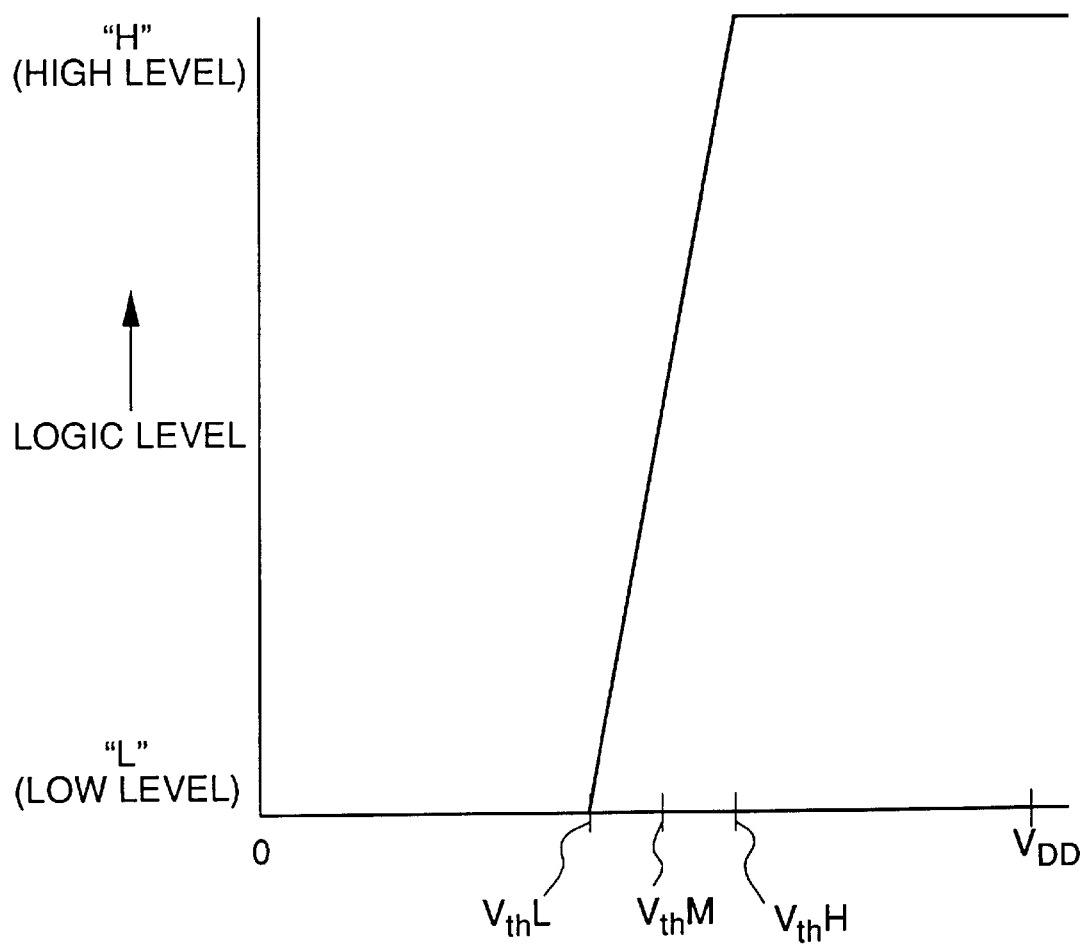
FIG. 2 shows a change of the threshold value of the driving circuit shown in FIG. 1.

FIG. 2 shows a change of the threshold value of the driving circuit shown in FIG. 1. In the figure, the logic threshold of the gate 13 is set as VthM, and this VthM is in general about a half of the source voltage VDD. Generally, the logic elements such as the gate 13 show sharp output voltage changes.

Here, it is assumed that the critical input voltage, wherein the output voltage becomes approximately the same as the source voltage VDD, is VthL, and the critical input voltage, wherein the output voltage becomes approximately the same as the ground voltage, is VthH, and the following equation is effective, VthL<VthM<VthH.

In the present embodiment, the high logic threshold inverter 6 is formed by one PMOS-Tr and two NMOS-Trs connected in series. The gate widths and the gate lengths of the respective MOS-Trs are determined such that the theoretical value of the low logic threshold inverter 7 becomes VthH.

In the present embodiment, if the voltage at the output terminal 24 is lower than VthL, the output terminal 22 of the high logic threshold inverter 6 and the output terminal 23 of the low logic threshold inverter 7 are converted into "H".

When "H" is input at the input terminal 21, the load capacitance 11 is charged, because PMOS-Tr 2 is turned on, and NMOS-Tr 2 is turned off. At the time when the voltage at the output terminal 24 increases to VthH, the charging is completed, since the output terminal 22 of the high logic threshold inverter 6 becomes "L" and PMOS-Tr 2 is turned off.

Similarly, if the voltage at the output terminal 24 is higher than VthH the output terminal 22 of the high logic threshold inverter 6 and the output terminal 23 of the low logic threshold inverter 7 becomes "L".

When "L" is input in the input terminal 21, the PMOS-Tr 2 is turned off and NMOS-Tr 3 is turned on, so that the capacitive load is discharged. At the time when the voltage at the output terminal 24 decreases to VthL, the output terminal 23 of the low logic threshold inverter 7 becomes "H", thereby, NMOS-Tr 3 is turned off, and discharging is completed.

Generally, the electric power P for driving a capacitor having a capacitance of C to a voltage of VDD is expressed as, $$P = C \cdot VDD \cdot VDD \qquad (1)$$

However, in the present invention, the driving amplitude is reduced to VthH−VthL, so that the electric power is also reduced to, $$P = C \cdot VDD \cdot (VthH - VthL) \quad (2)$$

so that the noise can also be reduced.

In the present embodiment, such low amplitude load driving is achieved by the use of a driver of the source voltage, without using a low voltage source supply, so that the operation speed is higher than that when using a driver operated at a low source voltage.

In a stationary state, the driver circuit 1 of the present embodiment is operated as an output impedance, and a penetration current will not flow in the driver formed by PMOS-Tr 2 and NMOS-Tr 3.

The potential of the load is always monitored by high logic threshold inverter 6 and the low logic threshold inverter 7. Thus, when the voltage of the output terminal 24 becomes higher than VthL and less than VthH due to, for example, the noise from outside, the driver circuit 1 makes a prompt start and the voltage fluctuations by the noise are eliminated.

Compared with PMOS-Tr 2 and NMOS-Tr 3 for driving the large capacitive load, MOS-Trs for the high logic threshold inverter 6 and the low logic threshold inverter 7 may be small. Thus, in the present embodiment, it is not necessary to use a chip with a large area.

Since the gate capacitance of the high logic threshold inverter 6 and the low logic threshold inverter 7 are very small in comparison with the capacitance of the large capacitive load 11, the increase of the driving capacitance of the driver circuit 1 is negligible.

In the above description, a high logic threshold inverter formed by one PMOS-Tr and two NMOS-Trs 3 connected in series is shown as an example. However, in addition to the above formation, it is noted that the high logic threshold inverter may be formed by a combination of PMOS-Tr having a large ratio of width to length (W/L) of the PMOS-Tr and an NMOS-Tr having a small W/L.

Similarly, the low logic threshold inverter may be formed, for example, by a combination of a PMOS having a small W/L and an NMOS-Tr having a large W/L.

B. Second Embodiment

Figure 3:
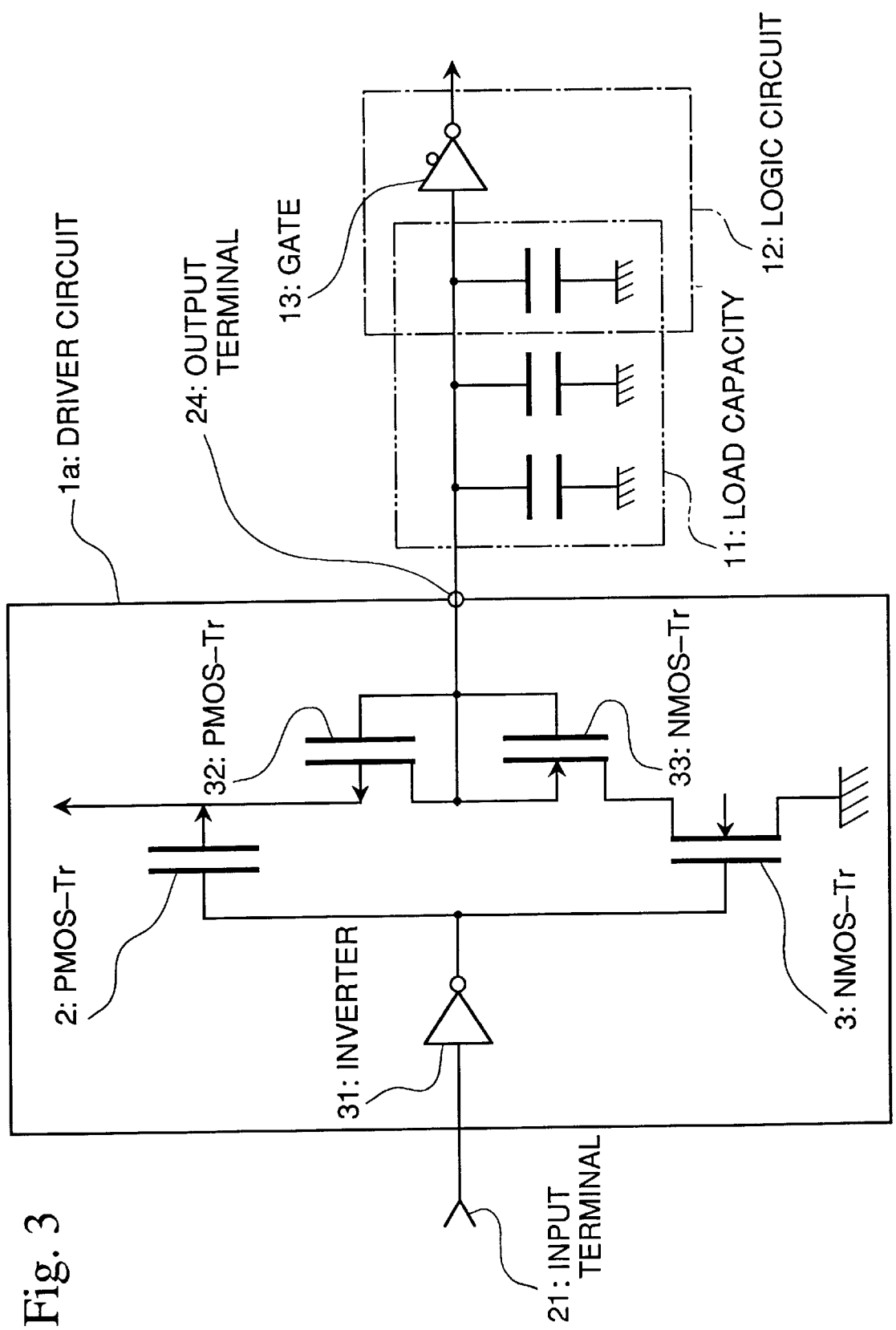
FIG. 3 is a connection diagram showing the construction of the driver circuit according to the second embodiment of the present invention.
Figure 4:
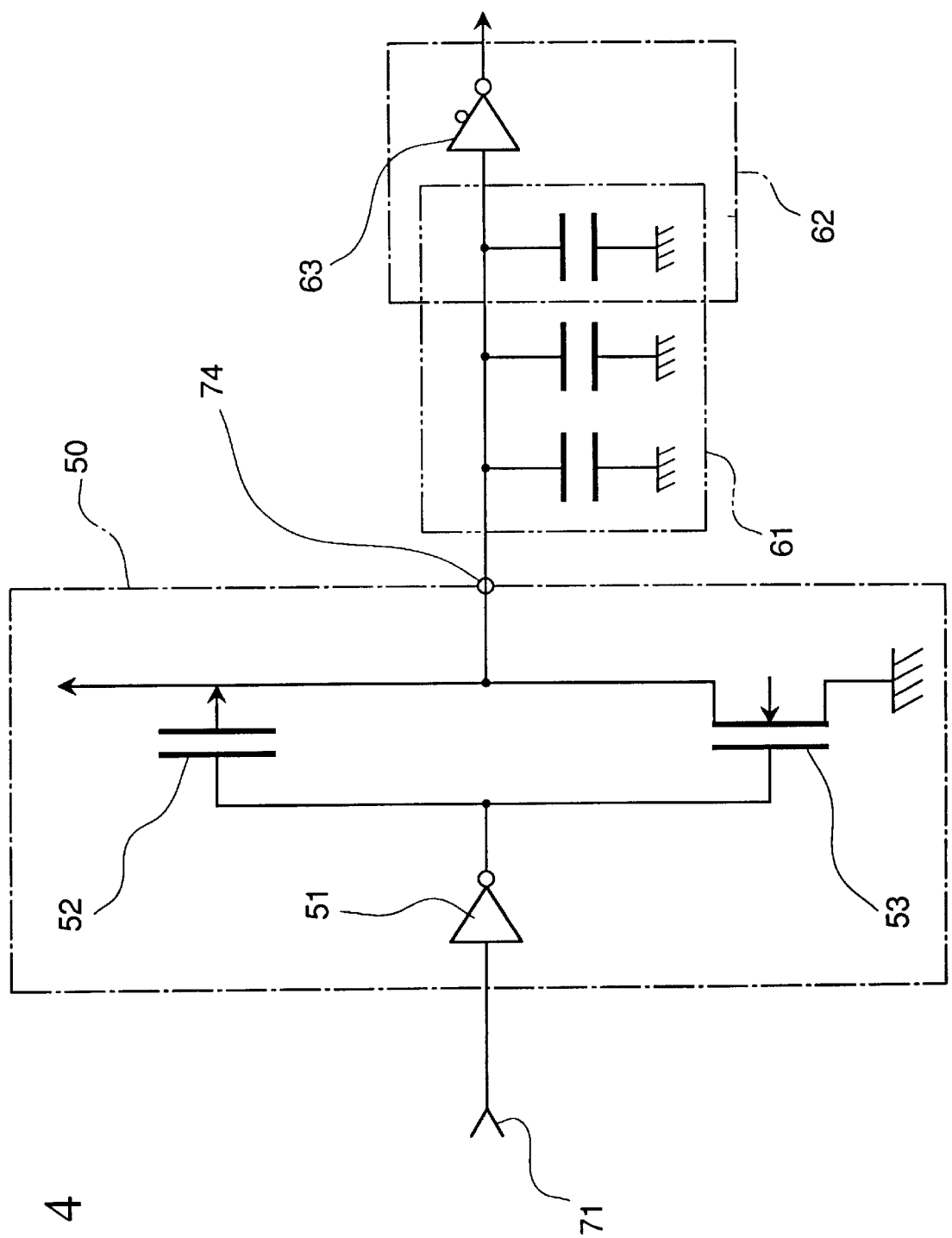
FIG. 4 shows a conventional driver circuit and an aspect of the output side of the driver circuit.

FIG. 3 is a connection diagram showing the construction of the driver circuit according to the second embodiment of the present invention. In the figure, the same elements as those in FIG. 1 are designated by the same reference numerals and the explanations of those elements are omitted.

The reference numeral 1a in FIG. 3 indicates a driver circuit which comprises PMOS-Tr 2, PMOS-Tr 32, and NMOS-Tr 3 and NMOS-Tr 33 connected to each other in series.

The reference numeral 31 indicates an inverter of a pre-driver. The output terminal of the inverter 31 is connected to the gate terminals of PMOS-Tr 2 and NMOS-Tr 3. The gate terminals of PMOS-Tr 32 and NMOS-Tr 33 are connected to the output terminal 24.

The on-resistance of PMOS-Tr 32 of the present embodiment decreases with reduced voltage of the output terminal 24. Thus, the driving current of the driver circuit la is large when the load capacity is not sufficiently charged, and the driving current decreases as the charging progresses. When the voltages from the source voltage VDD to the output terminal 24 reach a threshold voltage of the PMOS-Tr 32, the PMOS-Tr 32 is turned off, and charging is completed.

Similarly, the on-resistance of NMOS-Tr 33 is reduced as the voltage of the output terminal 24 increases. Thus, the driving current of the driver circuit 1a is large when the load capacitance is not sufficiently discharged, and the driving current decreases as the discharging progresses. When the voltage at the output terminal 24 reaches the threshold voltage of the NMOS-Tr 33, the NMOS-Tr is turned off, and discharging is completed.

Therefore, even when the voltage of the output terminal fluctuates due to a noise impinging from the outside into the driver circuit at a time when charging or discharging is completed and the output terminal 24 is floating, the driver circuit 1a will act and rapidly cancel the voltage fluctuation.

As hereinabove described, according to the present invention, the first driving means for switching on or off between the source voltage and the load, when the input voltage level is high, maintains the on state until the load voltage level exceeds the first voltage level by the first detecting means, and turns off when it is detected that the load voltage level is below the first voltage level. The second driving means for switching on/off between the ground potential and the load, when the input voltage level is low, maintains the on state until the second detecting means detects that the load voltage level is below the second voltage level, and turns off when the second detecting means detects that the load voltage level is below the second voltage level.

Furthermore, there are provided a first driving means and a third driving means connected in series between the source voltage and the load, and a second driving means and a fourth driving means connected in series between the load and the ground potential. When the input voltage level is high, the first driving means is turned on, and the third driving means is turned off when the load voltage level exceeds the first voltage level. The second driving means for switching on or off of the connection between the ground and load is turned off when the load voltage level exceeds the first voltage level, the fourth voltage level is turned off when the load voltage level is below the second voltage level. The first voltage level coincides with the upper limit of the threshold voltage range which the load carries within the boundary between the high voltage level and the low voltage level, and the second voltage level coincides with a lower limit of the threshold voltage range. Therefore, advantageous effects are obtained in that, if a logic circuit having a high capacity component is connected as a load, it is not necessary to output a large current output, which results in yielding a driver circuit capable of high speed operation or low noise operation.

According to the present invention, the driving amplitude of the load can be reduced within a range from the upper limit (VthH) to the lower limit (VthL) of the threshold voltage width. Thereby, the power consumption for driving the load capacity can be reduced.

The present invention sets the characteristics of the high logic threshold inverter and the low logic threshold inverter to conform with the electronic characteristics of the gate circuit of the input stage of the load. Thereby, it is not necessary to modify the circuit configuration at the load side. In addition, the circuit design can remain simple, and it is possible to use conventional designs as they are.

In the present invention, since the driving voltage is maintained at the source voltage VDD and the voltage amplitude for driving the load is set small, the driving circuit can be operated at high speed. Furthermore, since the driving current is small, it is possible to eliminate noise which will be generated at the source wiring or the ground wiring if the load is driven by a large current.

If the voltage of the output terminal is higher than VthH or lower than VthL, the output terminal will be opened and the output terminal is electrically separated from the source wiring or the ground wiring. Thereby, even if there is noise in the source wiring or the ground wiring, it is not likely that the noise will appear as voltage fluctuations at the output terminal.

Furthermore, when the driver circuit is not in operation, the PMOS-Tr and the NMOS-Tr are turned off. When transmission of input signals starts, either one of PMOS-Tr or NMOS-Tr is turned on. However, the other one of the PMOS-Tr or NMOS-Tr remains in the off state, so that the penetration current is extremely low.

What is claimed is:

1. A driver circuit comprising:
   a first detecting means for detecting that a voltage level of a load exceeds a first voltage level (VthH) existing between a source potential level and a logic threshold voltage level of a logic gate located at a receiving side;
   a second detecting means for detecting that the voltage level of the load is below a second voltage level (VthL) existing between a ground potential level and said first voltage level;
   a first driving means for driving to switch on/off a connection between the source and the load based on an input voltage level and a detection result by said first detecting means; and
   a second driving means for driving to switch on/off a connection between the ground and the load based on the input voltage level and a detection result by said second detecting means.

2. A driver circuit according to claim 1, wherein said first detecting means comprises a logic gate having a high logic threshold value, and the logic gate comprises an inverter comprising a P-channel field effect transistor having a large ratio of gate width to gate length and an N-channel field effect transistor having a small ratio of gate width to gate length.

3. A driver circuit according to claim 1, wherein said second detecting means comprises a logic gate having a low logic threshold value, and said logic gate comprises an inverter comprising a P-channel field effect transistor having a small ratio of gate width to gate length and an N-channel field effect transistor having a large ratio of gate width to gate length.

4. A driver circuit according to claim 1, wherein,
   when said input voltage level is high, said first driving means is maintained at the on state until it is detected that the voltage level of the load exceeds said first voltage level by said first detecting means; and,
   said first driving means is turned off when it is detected that the voltage level of the load exceeds the first voltage level by said first detecting means.

5. A driver circuit according to claim 1, wherein,
   when the input voltage level is low, said second driving means is maintained at the on state until it is detected that the voltage level of the load exceeds said second voltage level by the second detecting means; and
   said second driving means is turned off when it is detected that the voltage level of the load is below the second voltage level by said second detecting means.

6. A driver circuit comprising:
   a first driving means which is turned on when the input voltage level is at a high voltage level; and
   a second driving means which is turned off when the voltage level of the load exceeds a first voltage level (VthH) existing between a source potential level and a logic threshold voltage level of a logic gate located at a receiving side;
   wherein said first driving means and said second driving means are connected in series in between the source voltage source and said load.

7. A driver circuit according to claim 6, further comprising:
   a third driving means which is turned on when the input voltage level is high; and
   a fourth driving means which is turned off when the voltage level of the load is below a second voltage level (VthL) existing between a ground potential level and said first voltage level;
   wherein said fourth driving means and said third driving means are connected in series in between a ground potential and said load.

8. A driver circuit according to claim 1, wherein said first voltage level is higher than the logic threshold of the logic gate for receiving signals from the driver circuit and said first voltage level is a potential which makes a penetration current flowing in said logic gate sufficiently small when said voltage level is input in the logic gate located at the receiving side.

9. A driver circuit according to claim 1, wherein said second voltage level is below the logic threshold of the logic gate for receiving signals from the driver circuit and said second voltage level is a potential which makes a penetration current flowing in said logic gate sufficiently small when said voltage level is input in the logic gate located at the receiving side.

10. A driver circuit comprising:
    a first detector for detecting that a voltage level of a load exceeds a first voltage level (VthH) existing between a source potential level and a logic threshold voltage level of a logic gate located at a receiving side;
    a second detector for detecting that the voltage level of the load is below a second voltage level (VthL) existing between a ground potential level and said first voltage level;
    a first driving element for driving to switch on/off a connection between the source and the load based on an input voltage level and a detection result by said first detector; and
    a second driving element for driving to switch on/off a connection between the ground and the load based on the input voltage level and a detection result by said second detector.

11. A driver circuit according to claim 10, wherein said first detector comprises a logic gate having a high logic threshold value, and the logic gate comprises an inverter comprising a P-channel field effect transistor having a large ratio of gate width to gate length and an N-channel field effect transistor having a small ratio of gate width to gate length.

12. A driver circuit according to claim 10, wherein said second detector comprises a logic gate having a low logic threshold value, and said logic gate comprises an inverter comprising a P-channel field effect transistor having a small ratio of gate width to gate length and an N-channel field effect transistor having a large ratio of gate width to gate length.

13. A driver circuit according to claim 10, wherein,
    when said input voltage level is high, said first driving element is maintained at the on state until it is detected that the voltage level of the load exceeds said first voltage level by said first detector; and,
    said first driving element is turned off when it is detected that the voltage level of the load exceeds the first voltage level by said first detector.

14. A driver circuit according to claim 10, wherein, when the input voltage level is low, said second driving element is maintained at the on state until it is detected that the voltage level of the load exceeds said second voltage level by the second detector; and said second driving means is turned off when it is detected that the voltage level of the load is below the second voltage level by said second detector.

15. A driver circuit according to claim 10, wherein said first voltage level is higher than the logic threshold of the logic gate for receiving signals from the driver circuit and said first voltage level is a potential which makes a penetration current flowing in said logic gate sufficiently small when said voltage level is input in the logic gate located at the receiving side.

16. A driver circuit according to claim 10, wherein said second voltage level is below the logic threshold of the logic gate for receiving signals from the driver circuit and said second voltage level is a potential which makes a penetration current flowing in said logic gate sufficiently small when said voltage level is input in the logic gate located at the receiving side.

17. A driver circuit comprising:

a first driving element which is turned on when the input voltage level is at a high voltage level; and a second driving element which is turned off when the voltage level of the load exceeds a first voltage level (VthH) existing between a source potential level and a logic threshold voltage level of a logic gate located at a receiving side;

wherein said first driving element and said second driving element are connected in series in between the source voltage source and said load.

18. A driver circuit according to claim 17, further comprising:

a third driving element which is turned on when the input voltage level is high; and a fourth driving element which is turned off when the voltage level of the load is below a second voltage level (VthL) existing between a ground potential level and said first voltage level;

wherein said fourth driving element and said third driving element are connected in series in between a ground potential and said load.

* * * * *